(12) United States Patent
Dutta

(10) Patent No.: US 8,716,594 B2
(45) Date of Patent: May 6, 2014

(54) HIGH EFFICIENCY PHOTOVOLTAIC CELLS WITH SELF CONCENTRATING EFFECT

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 792 days.

(21) Appl. No.: 11/859,742

(22) Filed: Sep. 22, 2007

(65) Prior Publication Data

US 2008/0072958 A1   Mar. 27, 2008

Related U.S. Application Data

(60) Provisional application No. 60/827,015, filed on Sep. 26, 2006.

(51) Int. Cl.
  *H01L 31/00* (2006.01)
(52) U.S. Cl.
  USPC .......................................... 136/256; 136/255
(58) Field of Classification Search
  CPC .................. H01L 31/0352; H01L 31/035281; H01L 31/03529
  USPC .................................................. 136/256, 255
  See application file for complete search history.

(56) References Cited

U.S. PATENT DOCUMENTS

| | | | | | |
|---|---|---|---|---|---|
| 3,591,420 | A | * | 7/1971 | Streed | 136/257 |
| 4,135,950 | A | * | 1/1979 | Rittner | 136/255 |
| 4,348,254 | A | * | 9/1982 | Lindmayer | 438/71 |
| 4,406,913 | A | * | 9/1983 | Weyrich | 136/259 |
| 4,608,451 | A | * | 8/1986 | Landis | 136/256 |
| 4,909,856 | A | * | 3/1990 | Ralph | 136/256 |
| 5,681,402 | A | * | 10/1997 | Ichinose et al. | 136/256 |
| 2004/0021062 | A1 | * | 2/2004 | Zaidi | 250/214 R |
| 2004/0157354 | A1 | * | 8/2004 | Kuriyama et al. | 438/45 |
| 2006/0207647 | A1 | * | 9/2006 | Tsakalakos et al. | 136/256 |
| 2008/0006319 | A1 | * | 1/2008 | Bettge et al. | 136/244 |

OTHER PUBLICATIONS

Bettge, U.S. Appl. No. 60/810,901, filed Jun. 5, 2006.*
Bai, "Aligned 1D silicon nanostructure arrays by plasma etching", Science and Technology of Advanced Materials 6 (2005) 804-808.*

* cited by examiner

Primary Examiner — Devina Pillay

(57) ABSTRACT

Novel structures of photovoltaic cells (also called as solar cells) are provided. The Cells are based on the micro (or nano) structures which could not only increase the surface area but also have the capability of self concentrating the solar spectrum incident onto the cell. These photovoltaic cells have large power generation capability per unit physical area over the conventional cells. These cells will have enormous applications such as in space, in commercial, residential and industrial applications.

6 Claims, 13 Drawing Sheets

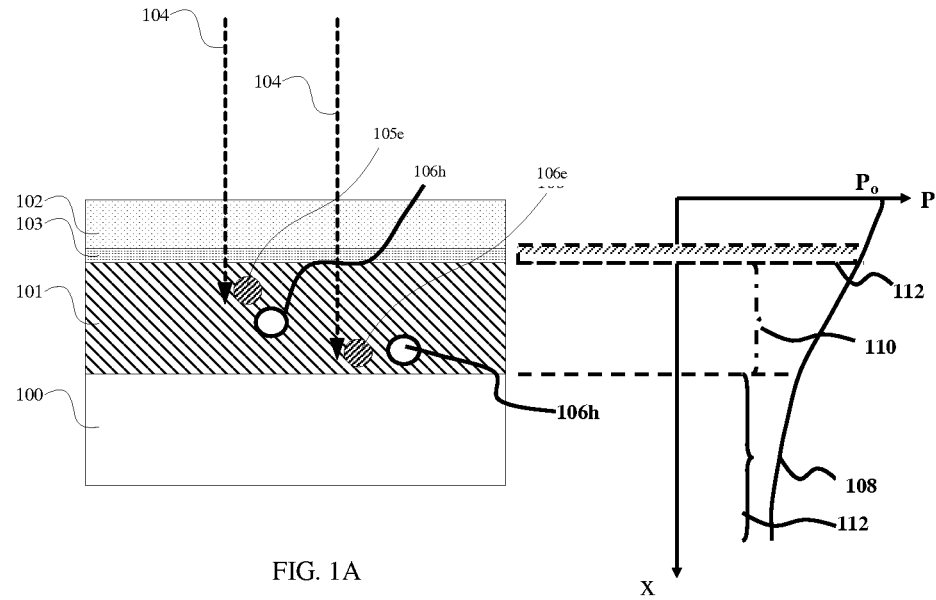
FIG. 1A
PRIOR ART
FIG. 1B
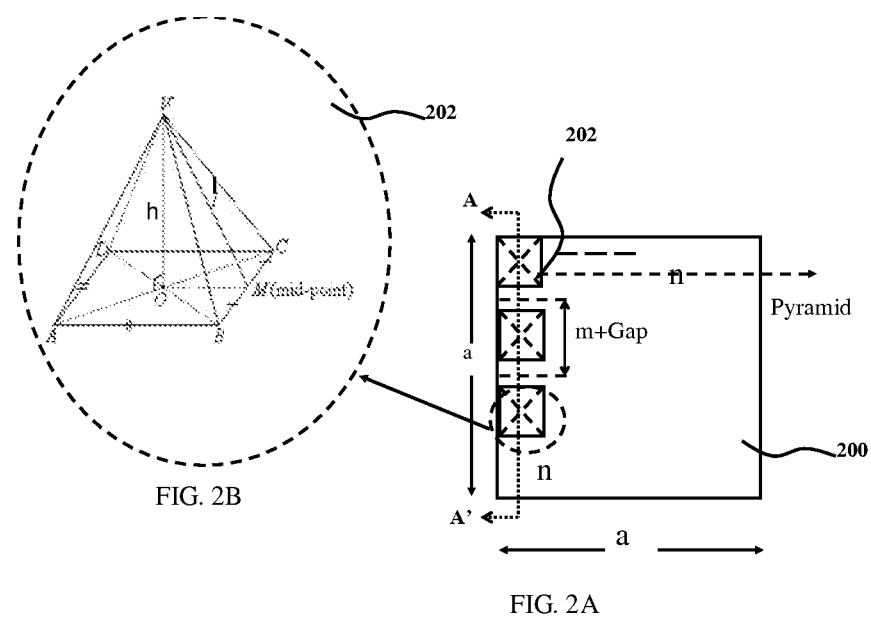
FIG. 2B
FIG. 2A
FIG. 2

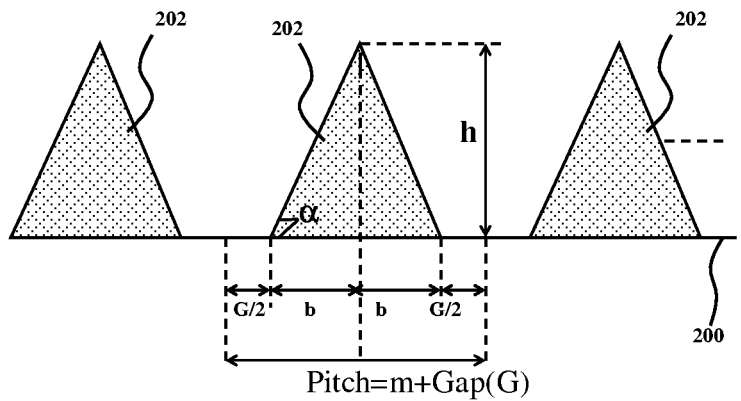
Gap between two pyramid= G , height=h, angle=α
Base of the pyramid= 2b=m
Maximum base ($b_{max}$) =G/2+b
Minimum base ($b_{min}$) ~0
FIG. 2C
FIG. 2
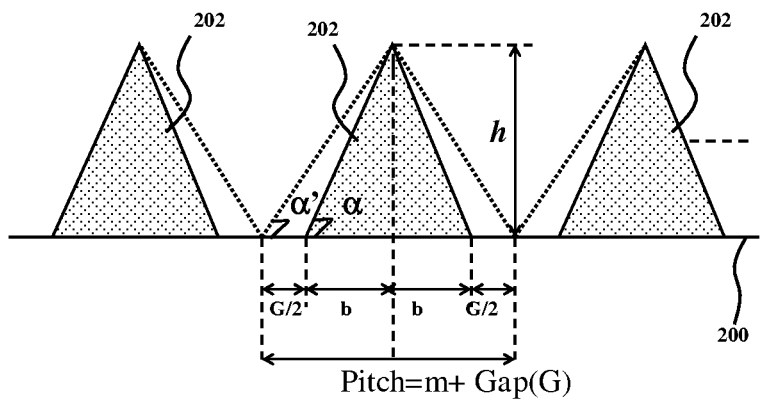
Minimum angle=a' for fixed *h*
Maximum base ($b_{max}$) =G/2+b and min. angle=a'
Minimum base ($b_{min}$) ~0 and max. angle ~90°
FIG. 2D
FIG. 2

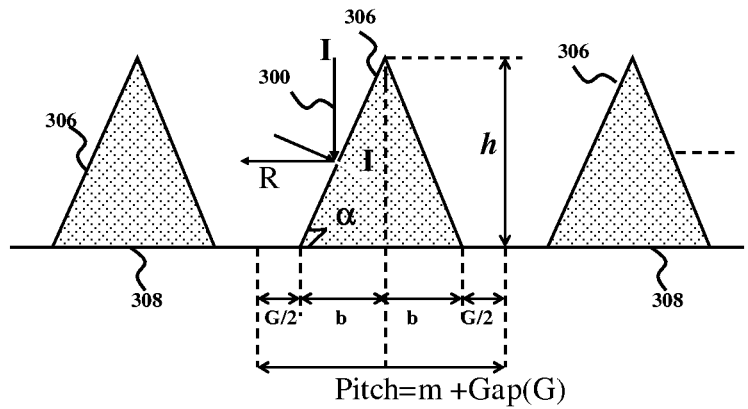

For tilted side of angle a,

Light transmitted to tilted side for a light component having Intensity *I* is *I*(cosa), and reflected light (*R*) = *I*(1-cosa), When a' is minimum and maximum transmission is possible

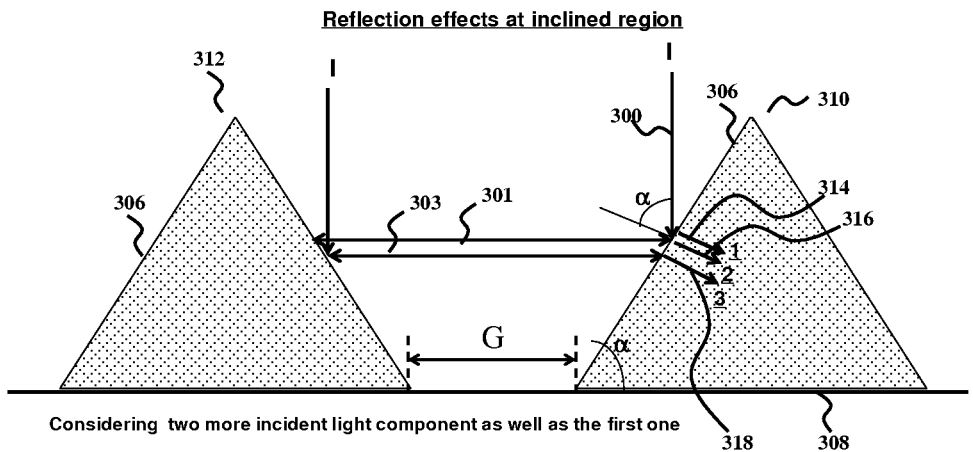

The first component :   $I \times \cos(\alpha)$

The second component :   $I \times \dfrac{\cos(\alpha)}{1-(1-\cos(\alpha))^2}$

The third component :   $I \times \dfrac{\cos(\alpha)(1-\cos(\alpha))}{1-(1-\cos(\alpha))^2}$

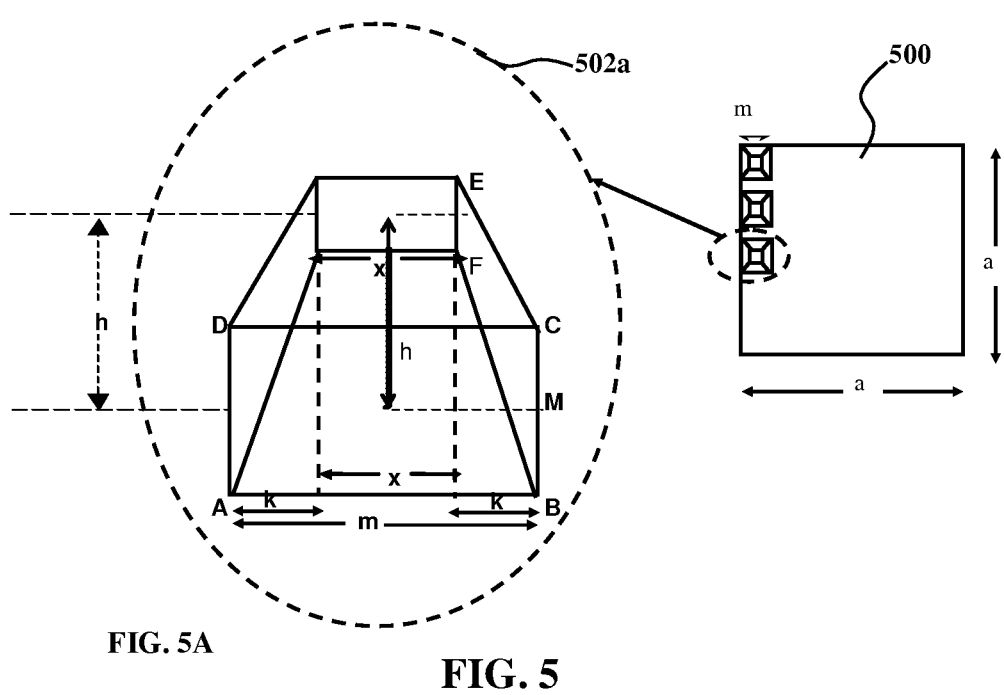
FIG. 5A
FIG. 5
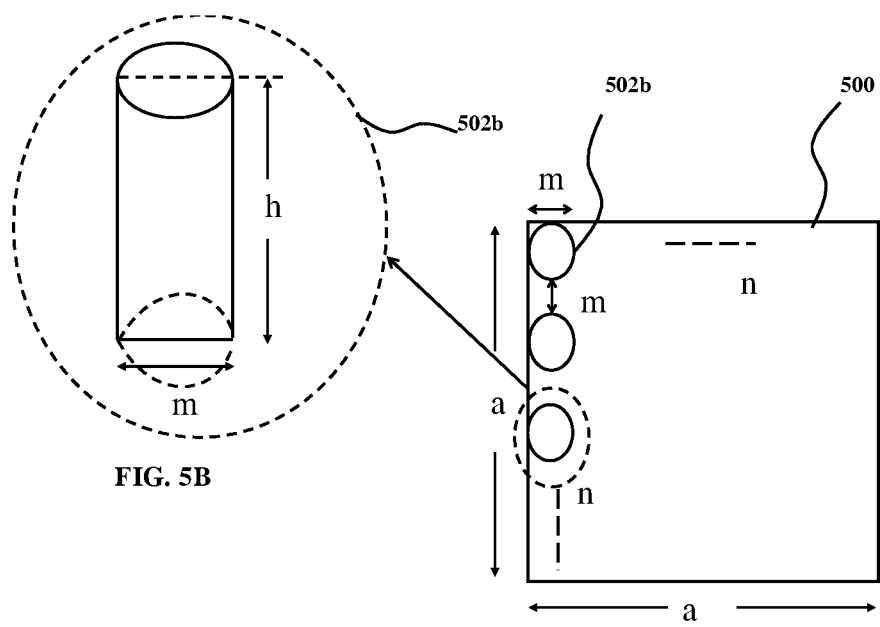
FIG. 5B
FIG. 5

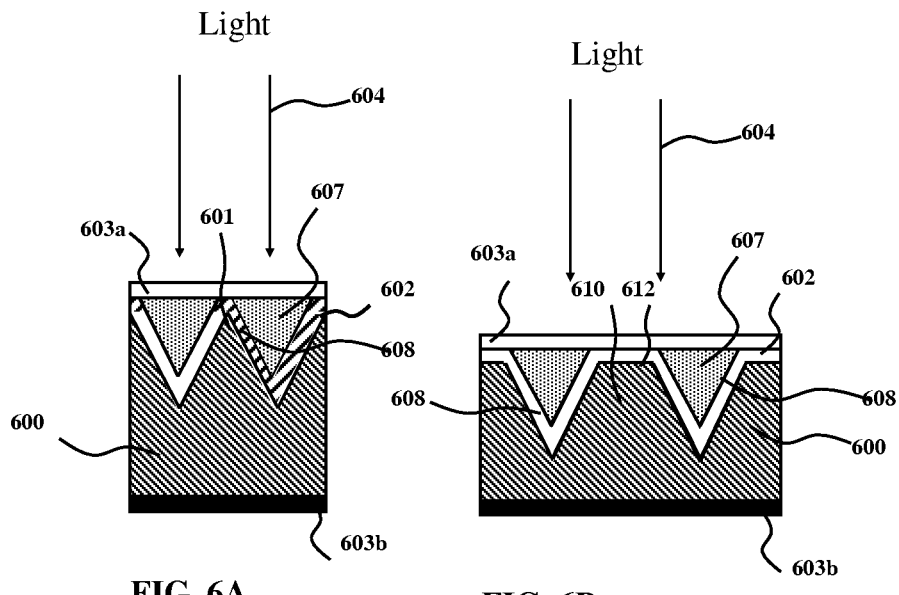
FIG. 6A    FIG. 6B
FIG. 6
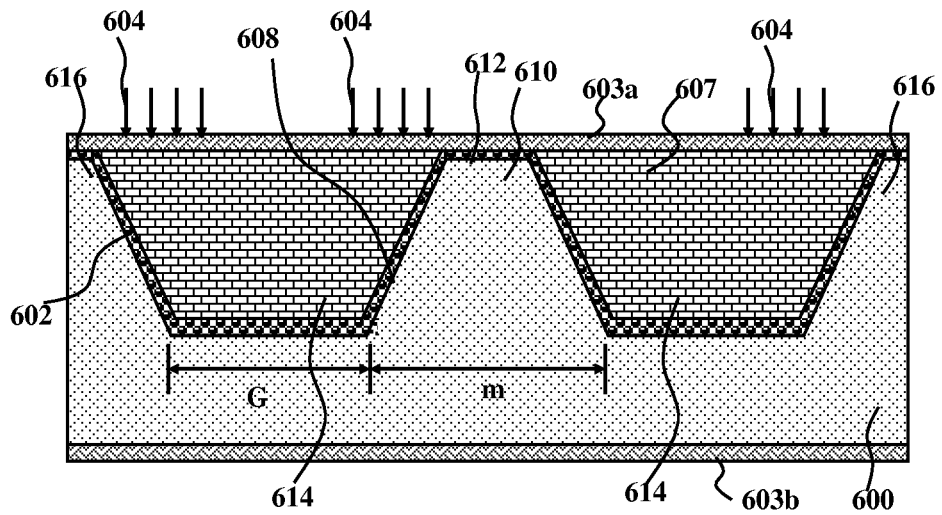
FIG. 6C
FIG. 6

HIGH EFFICIENCY PHOTOVOLTAIC CELLS WITH SELF CONCENTRATING EFFECT

CROSS REFERENCE TO RELATED APPLICATIONS

This application claims the benefit of U.S. Provisional Application No. 60/827,015 filed Sep. 26, 2006.

FIELD OF INVENTIONS

This patent specification relates to structures of photovoltaic cells (hereafter mentioned as also "solar cells"). More specifically, it relates to photovoltaic cells comprising with structures for increasing the junction area and also for absorbing broad solar spectral for increasing power generation capability per unit area. This also relates with the photovoltaic cells having elf amplifying capabilities concentrating (increasing) light intensity incident on its surface. This also relates to photovoltaic cells comprising with nano-scaled blocks. These photovoltaic cells can be used in commercial, residential, and also industrial application for power generation.

BACKGROUND OF THE INVENTIONS

Photovoltaic cells where light is converted into electric power have been prevailing in a wide range of application fields such as consumer electronics, industrial electronics, and space exploration. In consumer electronics, photovoltaic cells that consist of materials such as amorphous silicon are choices for a variety of inexpensive and low power applications. Typical conversion efficiency, i.e. the solar cell conversion efficiency, of amorphous silicon based photovoltaic cells ranges between ~10% [Yamamoto K, Yoshimi M, Suzuki T, Tawada Y, Okamoto T, Nakajima A. *Thin film poly-Si solar cell on glass substrate fabricated at low temperature*. Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as residential and industrial solar power generation systems, either poly-crystalline or single-crystalline silicon is the choice because of more stringent requirements for better reliability and higher efficiency than the applications in consumer electronics. Photovoltaic cells consisting of poly-crystalline and single-crystalline silicon generally offer the conversion efficiency ranging ~20% and ~25% [Zhao J, Wang A, Green M, Ferrazza F. Novel 19.8% efficient 'honeycomb' textured multicrystalline and 24.4% monocrystalline silicon solar cell. *Applied Physics Letters* 1998; 73: 1991-1993.] respectively. As many concerns associated with a steep increase in the amount of the worldwide energy consumption are raised, further development in industrial solar power generation systems has been recognized as a main focus. However, due to high cost ($3 to $5/Watt) of today's Si-based solar cell, this Si-solar cell is not yet widely accepted as an alternative source for the energy solution.

Group II-VI compound semiconductors, for example CdTe and CdS, have been investigated in the context of having industrial solar power generation systems manufactured at a lower cost with maintaining a moderate conversion efficiency, resulted in a comparable conversion efficiency ~17% [Wu X, Keane J C, Dhere R G, DeHart C, Duda A, Gessert T A, Asher S, Levi D H, Sheldon P. 16.5%—efficient CdS/CdTe polycrystalline thin-film solar cell. *Proceedings of the 17th European Photovoltaic Solar Energy Conference*, Munich, 22-26 Oct. 2001; 995-1000.] to those for the single crystalline silicon photovoltaic devises, however toxic natures of these materials are of great concerns for environment.

Group I-III-VI compound semiconductors, such as CuInGaSe$_2$, have been also extensively investigated for industrial solar power generation systems. This material can be synthesized potentially at a much lower cost than its counterpart, single crystalline silicon, however conversion efficiency, ~19%, comparable to that of single crystalline silicon based cells can be obtained, so far, by only combining with the group II-VI compound semiconductor cells [Contreras M A, Egaas B, Ramanathan K, Hiltner J, Swartzlander A, Hasoon F, Noufi R. Progress toward 20% efficiency in Cu(In,Ga)Se polycrystalline thin-film solar cell. *Progress in Photovoltaics: Research and Applications* 1999; 7: 311-316.], which again raise issues associated with toxic natures of these materials.

A type of photovoltaic cells designed for several exclusive applications such as space, where the main focus is high conversion efficiency and cost is not the main factor. Generally, this solar cell consists of group III-V semiconductors including GaInP and GaAs. Synthesis processes of single crystalline group III-V are in general very costly because of substantial complications involved in epitaxial growth of group III-V single crystalline compound semiconductors. Typical conversion efficiency of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey G S, Cotal H L, Ermer J H, Sherif R A, Karam N H. *Lattice-matched and metamorphic GaInP/GaInAs/Ge concentrator solar cells. Proceedings of the World Conference on Photovoltaic Energy Conversion (WCPEC-3)*, Osaka, May 2003; to be published.], usually more than 10 times than the conventional Si-solar cell.

All types of photovoltaic cells in the prior arts described above, no matter what materials a cell is made of, essentially falls into one specific type of structure, which usually limits its power generation capability. Usually flat pn-junction structure is used in conventional solar cells (FIG. 1A). Shown in FIG. 1A is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generate electron-hole pairs after being absorbed by the p- and also n-type semiconductor layers 101 and 102. The incident light generates electrons 105$e$ and also holes 105$h$ in the region near the pn-junction 103 and also 106$e$ and 106$h$ in the region far from the pn-junction 103. The photo generated electrons (and holes) 105$e$ and 106$e$ (hereafter considering only electronics, i.e. minority carriers in p-type semiconductors, and the same explanation is applicable for holes, minority carriers in n-type semiconductors, also) diffusing toward the pn-junction 103 and entering the pn-junction 103 contribute to photovoltaic effect. This is also vice versa for the holes, existing as minority carriers in n-type semiconductor 102. The two key factors that substantially impact the conversion efficiency of this type of photovoltaic cell are photo carrier generation efficiency (PCGE) and photo carrier collection efficiency (PCCE).

The PCGE is the percentage of the number of photons entering a cell and contributing to the generation of photo carriers, which needs to be, ideally, as close as 100%. On the other hand, the PCCE is the percentage of the number of photo-generated electrons 105e and 106e reaching the pn-junction 103 and contributing to the generation of photocurrent. For a monochromatic light, the PCGE of ~100% can be achieved by simply making the p-type layer 101 thicker, however, electrons 106e generated at the region far away from the pn-junction 103 cannot be collected efficiently due to many adverse recombination processes that prevent photo generated carriers from diffusing into the pn-junction 103, thus the basic structure of current photovoltaic cells has its own limitation on increasing the conversion efficiency. As the minority carrier travel through the semiconductors, the longer the life-time, the less the recombination, which makes the higher the conversion efficiency. Usually, using of thicker and high quality wafer, the conversion efficiency of conventional solar cell can be increased to some extend mentioned earlier. However, this makes the solar cell costly and heavier. In addition to increase the collection efficiency, the absorption of the broad solar spectrum also increase the conversion efficiency.

Furthermore, increasing of the intensity of the solar spectrum helps to also increase the conversion efficiency, thereby increasing the power generation capacity. Conventionally, using of the concentrator separately with solar cell is used to increase the conversion efficiency. It requires additional component with solar cell to concentrate the solar spectrum.

It is highly desirable to have the solar cell structure having (a) high PCCE which is independent to the substrate thickness, (b) the ability of absorption of broad solar spectrum, and (c) self concentrating capability to increase the intensity of solar spectrum incident per unit area.

FIG. 1B shows typical monochromatic light intensity behavior inside the semiconductor, and the light intensity p at certain depth x can be expressed as $p(x)=P_o\exp(-\alpha x)$, where $P_o$ is the peak intensity at the surface and $\alpha$ is the absorption co-efficient of the semiconductor in which light is entering. As shown in FIG. 1B, the light intensity behavior 108 inside bulk semiconductor is exponential. Carriers (not shown here) generated due to light flux 112 absorbed by pn-junction is only drifted by junction field and can be collected efficiently. Whereas, carriers 106e and 106h generated due to absorption of light-flux 110 by semiconductor region 101 are diffused to all direction. Only those which are generated closer (distance equal to or less than the diffusion-length of the semiconductor) to pn-junction, can be collected. Those carriers which are generated far away (distance longer than the diffusion-length of the semiconductor) from pn-junction are recombined and lost. The light flux 112 is usually lost either by going out or absorbed by the substrate. Both PCGE and PCCE are mainly dependent on material and structure of the photovoltaic cells, and today's photovoltaic cells are structured in such a way that (a) wide ranges of solar spectrum cannot be absorbed due to its material limitation, and (b) photo carrier's collection efficiency is lower due to its inherent structure. For example, it is found that typical conversion efficiency of today's crystal-Si based solar cell is ~18%. Wavelengths of solar spectrum spreads from <0.1 to 3.5 μm in which Si can only absorb ~0.4 to 0.9 μm of light. ~50% of light belong to solar spectrum can not be absorbed by Si, due to have its inherent material properties. The rest of 32% are lost due to (i) recombination of photo-generated carriers and (ii) losing of light which is 112 as shown in FIG. 1B, and these two factors are structure dependent. If we could reduce these two factors, ~50% conversion efficiency can be achieved even in Si-based solar cell.

If we could capture different wavelengths of light belonged to solar spectrum by utilizing different material systems or nano-material systems, we could increase the conversion efficiency ideally close to 100%. Furthermore, if the solar cell (photovoltaic cell) detection capability can be extended to infrared-spectrum, then the cell can produce electrical energy not only during day (while sun is present), but also at night (when different infrared is present). Besides, today's solar cell material is not highly radiation-tolerant. In space application specially, photovoltaic cells should have a structure and material systems, which could generate high-power per unit area and also to highly radiation tolerant. To increase the conversion efficiency (ideally close to 100%), it would be desirable to have photovoltaic cell structures (a) which has larger surface area to volume ratio to capture all the photons (at specific wavelength) entering the cell and a pn-junction that is located at as close to the photo absorption region as possible, (b) amplifying capabilities by concentrating the light incident to its surface, and (c) structure comprising with the material systems having photo responses at different spectrum to efficiently cover a wide range of spectrum of light that enters a photovoltaic cell. It would be further desirable to have solar cell which could generate electric power in both day and night.

In addition to conversion efficiency, cost-effective manufacturing is also another factor requiring some focus. In today's solar cell, high-cost is also one of the main factor in addition to issue of low conversion efficiency. It is found that more than 90% of solar cell is silicon (Si) based solar cell in which crystal silicon (Si) wafer is the based material, and the rest of others are thin-film based solar cell. In manufacturing of Si-based solar cell, more than 50% of cost is originated from Si-wafer cost and the rest are from other cost such as process and integration. Usage of less silicon for the fixed conversion efficiency would help to reduce the power generation cost. It is highly desirable to focus onto the less usage of Si (to reduce the wafer cost) at the same time while increasing the conversion efficiency.

BRIEF SUMMARY OF THE INVENTION

Accordingly, it is an object of the invention to provide the structures of the photovoltaic cells, which could have high power generation capability per unit area over conventional counterpart, mentioned as the prior arts.

According to this invention, it is an object to have an photovoltaic cell structure having self concentrating capabilities to amplify the solar spectrum incident onto its surface.

According to this invention, it is an object to reduce the carriers-recombination and also to increase the absorption of the light by increasing the effective junction area, which increases the photo-generated carriers.

According to this invention, it is an object to increase the absorption bandwidth of solar spectrum to increase the conversion efficiency.

It is an object providing solar cell structures based on nano-scaled blocks structures which is formed on the base substrate. The pn- or Schottky junction are formed with nano-blocks, generating built-in potential by which photo generated electrons and holes are swept away, leading to photovoltaic effect.

Alternatively, the base substrate or carrier substrate could be formed in micro-nano blocks (structures) by either molding or etching process, and the junction is formed utilizing the similar semiconductor or two different type of semiconductors deposited on the micro-nano blocks. The base or carrier substrate could be semiconductor, metal or dielectric material. The pn- or Schottky junction are formed with nanoblocks, generating built-in potential by which photo generated electrons and holes are swept away, leading to photovoltaic effect.

It is an object to increase the surface area to increase the incident light intensity per unit its base area.

It is an object providing various solar cell structures based on trapezoidal, pyramid, cone, or cylindrical to increase the ratio of junction area to the volume, to increase the conversion efficiency According to this invention, the supporting substrate can be Si, CdTe, Cu, GaAs, InP, GaN, glass, polymer, ceramics, metal foil, Ge, C, ZnO, BN, $Al_2O_3$, AlN, Si:Ge, CuInSe, II-VI and III-V.

It is also object to form the structure made from electronics materials on which semiconductor pn, schotky, or MIS junction can be formed and that electronics materials can be formed on the base substrate like Si, Ge, metal-foil, or glass to make the low-cost.

It is also another object of this invention to provide the structures of the photovoltaic cells which can capture most of the wavelengths belonged to solar spectrum and can provide >80% conversion efficiency.

It is also another object of this invention to provide the structures of the photovoltaic cells which can generate the electric power in both day and night.

It is also another object of this invention to provide low-cost manufacturing process for the photovoltaic cell for making.

This invention offers to achieve ideally >50% of conversion efficiency utilizing Si-materials and >80% of conversion efficiency for other materials. The main advantages of these inventions are that today's matured process technologies can be used to fabricate the photovoltaic cell which has the power generation capability a few order and beyond as compared with that of conventional photovoltaic cell.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein:

FIG. 1A is the schematics showing the cross-sectional view of a conventional photovoltaic cell structure and FIG. 1B is the schematic showing the light penetration as a function of the solar cell depth. This is the explanatory diagram showing the prior-art of today's photovoltaic cell and the light intensity behavior inside semiconductor materials.

FIGS. 2A and 2B are the schematics showing the top and cross-sectional views of photovoltaic cell based on the cone (pyramid)-structure to show the benefit of the invention, in accordance to the present invention.

FIGS. 2C and 2D are the cross-sectional views as seen from A-A' section of the FIG. 2A to show the physical parameters used in the description of the preferred embodiment.

FIGS. 3A and 3B are the schematics showing the cross-sectional views as seen from A-A' section of FIG. 2A and also showing the effect of other nearest neighbors-pyramid blocks in total effective light, incident to its tilted side, in accordance to the present invention.

FIGS. 5A, 5B, and 5C are the schematics showing cross-sectional views of various structures for photovoltaic cells according to this invention.

FIGS. 6A, 6B, and 6C are the cross-sectional views of various photovoltaic cells formed on the electronic materials according to this invention, wherein the structures are similar to those as described in FIGS. 2 and 5A.

FIG. 8 is the cross-sectional view of a thin-film based photovoltaic cell formed on the substrate acting as the carrier substrate according to this invention, wherein

DETAILED DESCRIPTION

Figures 3, 3C:
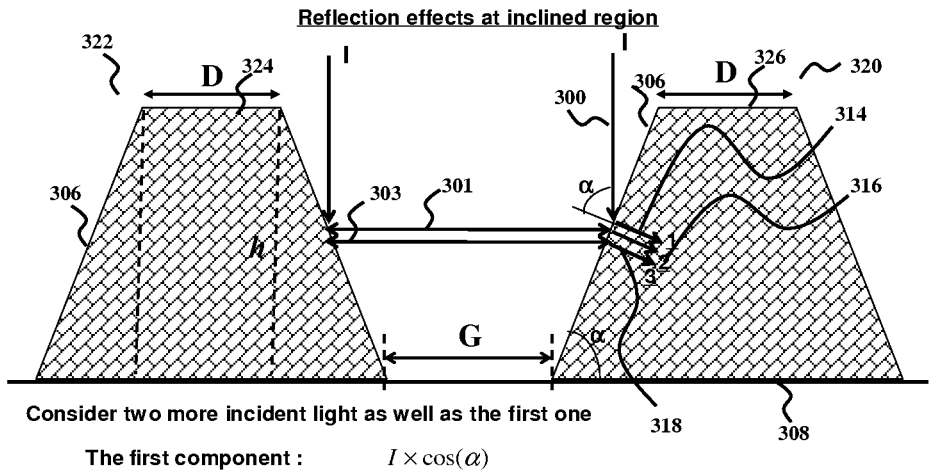
FIG. 3C is the cross-sectional view of the photovoltaic cell made from trapezoidal blocks showing the effect of nearest neighbor-blocks effect and also showing their different light components incident and transmitted to the tilted side.

According to this present invention it is our object providing several photovoltaic cell structures which have (a) capability of higher surface area to volume, (b) self concentrating capability, (c) absorption of broad spectrum, and (d) pn-junction very close to the surface. These all capabilities would help to increase conversion efficiency as high as >60%. Before proceeding to give detail explanation of the photovoltaic cell structure and their manufacturing, various structures including simulation results are given to show the benefits of the increasing the surface area (equivalent to junction area) and self-concentrating capability in the photovoltaic cell.

FIGS. 2A and 2B are the schematics representing the cone (or pyramid)-type structure 202 formed with the micro (or nano) block structures. The cone-structures are formed with specified pitch and base width m, and height h. They are formed onto the substrate 200. Alternatively, cone-structure 202 can be part of the substrate 200. In FIG. 2A, n×n number of the cone-structure 202 are arranged in a×a sized substrate 200 with thickness t. It is assumed that if we could make the n×n number of cone-like structure 202 on the a×a-base-area, it will increase the surface area. This indicates that the increment of the surface area in the proposed cell is higher than that of compared with the conventional photovoltaic cell which is usually flat. As shown in FIGS. 2C and 2D, consider the gap between two pyramids (or cone) is G, base width is 2b (=m), and pitch of the pyramid arranged on the base, is 2b+G. The maximum ($b_{max}$) base width is 2b+G/2 and minimum base width ($b_{min}$) is zero (0). Pyramid height is considered to be h. As the height varies, the angle α also varies. The angle of the tilted side with respect to the base is α. The maximum attainable angle is 90 degree and minimum angle is α', as shown in FIG. 2C.

By varying the tilted angle α with adjusting of the height h, the intensity of solar light incident onto the tilted side and the gap, can be changed. FIGS. 3A and 3B are the schematics showing how solar light is reflected and change their direction after incident onto the proposed cell structure, as explained in FIG. 2. As shown in FIG. 3A, if the light intensity I 300 (from solar) is incident onto the side 306, whose angle is α with respect to the base 308, the light transmitted into the cell I' from the tilted side 306 is equal to I cos α and reflected light R=I(1−cos α). When the angle α' is minimum (see FIG. 2D), the maximum transmission of the solar light into the cell is possible from the tilted side 306.

Several reflections and transmission components are expected as shown in FIG. 3B, while solar light incident onto the tilted side 306 of one pyramid 310 (for example) and also its closet pyramid (or cone) 312. Assuming three components of transmitted lights into the cell from the tilted side, due to incident to close neighbors, first transmission component 314 is due to its own light I which is 300, and second transmitted component 316 is due to its own reflected light component 301 just after reflection from other pyramid 312, located very close to it. Third transmitted component 318 is due to the reflected light 303 from nearest pyramid 312. The first, second, and third light components 314, 316, and 318, respectively can be expressed as, First component: I×cos α  (1)

Second component: (I×cos α)/(1−(1−cos α)²)  (2)

Third Component: (I×cos α(1−cos α))/(1−(1−cos α)²)  (3)

Where, I is the light intensity per unit area and α is the tilted side 206 angle with respect to base 308. Three components (314, 316, and 318) are only considered. Other order of reflection components also transmitted and they are very minimal as compared with those of three components mentioned. Tilted side 306 is not only higher surface area than the base (according to the Pithagorean Theory). Increasing surface area with comparable light intensity incident and transmitted to the titled surface having larger area than that of base area (like flat cell) will help to increase the carrier generation.

FIG. 3C is the schematic showing how solar light is reflected and change their direction after incident onto the trapezoidal shaped structure. The explanation and numeral as used in FIGS. 3A and 3B are the same for FIG. 3C, so that repeated explanation is omitted here. Only difference is that the trapezoidal shaped structures 320 and 322 and the top base 324 are used in FIG. 3C. The light component transmitted to the cell and reflection due to the tilted side 306, as explained in FIG. 3B is also same in the case of FIG. 3C.

In pyramid or trapezoidal structures as explained in FIGS. 3A thru 3B, tilted side 306 has the same effect and the transmitted light components are the same for the same height of h. Light component I (300) incident on to the flat surface for example on the open top surface (for the case of FIG. 3C) 326 and the light component I' 328 incident on the flat surface created due to the gap 330 between two trapezoids 320 and 322, are different in intensity. The intensity I' of light 328 incident on the flat surface 330 located in between two trapezoids 320 and 322 is higher than those I of light 300 incident onto the top-flat surface 326 (e.g. top surface of FIGS. 3C and 3D). The light is concentrated and incident in between the trapezoids due to the multiple reflection beams from tilted side 306 which creates the angle α with respect to the base 308. The effective light beams intensity, incident onto the surface 330 located in between two trapezoids 320 and 322 is dependent onto the angle α. The intensity of light incident onto the opening surface 330 is dependent onto the angle α, the trapezoids height h, and the gap G.

Figures 3, 3D:
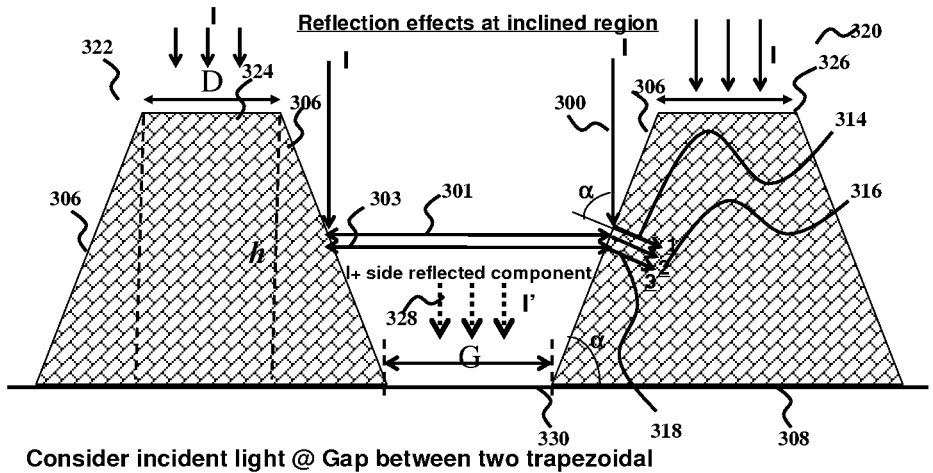
FIG. 3D is the schematic showing cross-sectional view of the photovoltaic cell comprising with trapezoidal blocks to show the amplifying or concentrating of the light intensity, incident on to the gap (G) region in between two blocks.
Figures 4, 4A:
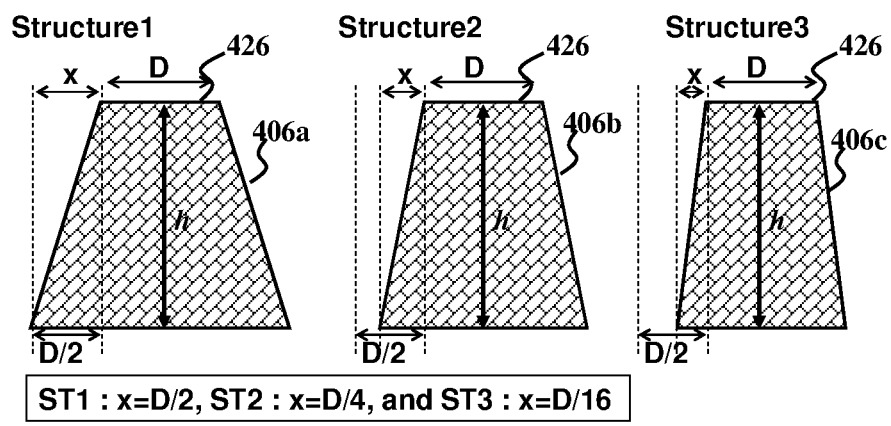
FIGS. 4A and 4B are the schematics showing cross-sectional views of the photovoltaic cell along with their physical parameters and the estimated conversion efficiency. Only closet surrounding block-effect is considered in estimating the conversion efficiency.
Figures 4, 4B:
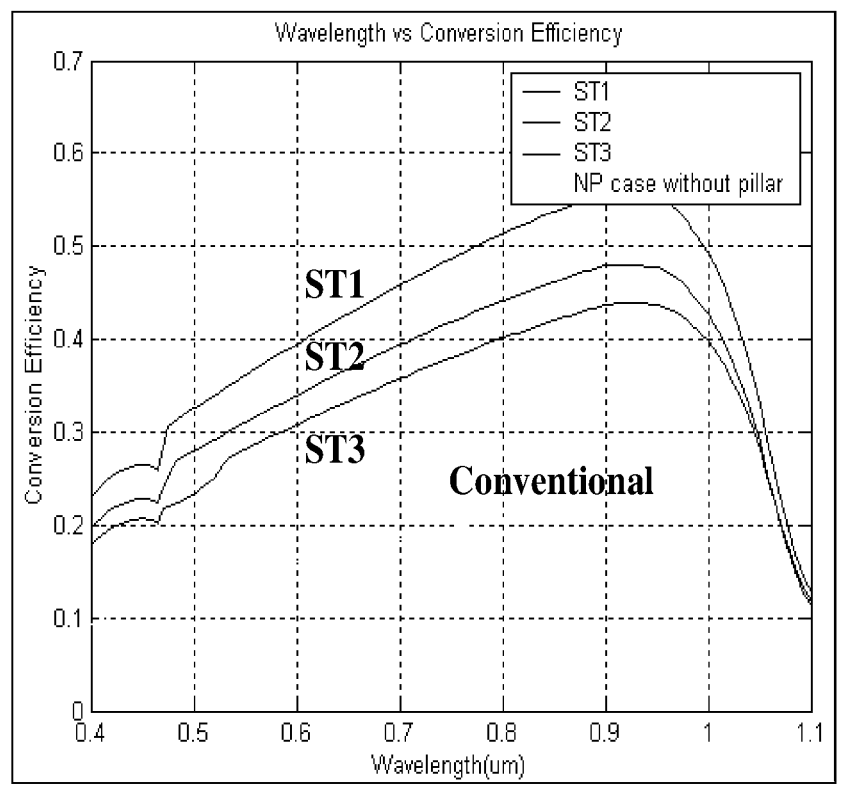

Coversion efficiency for the structure as shown in FIG. 3D is performed for the three variation of three structures as shown in FIG. 4A, the tilted sides of 406a, 406b, and 406c. The tilted angles and the gaps between two trapezoids (not shown here) are changed for the three structures as shown in FIG. 4A. Changing the tilted angle changes the gap between two trapezoids (not shown here) for the fixed height of the trapezoids. The distance between center and the edge of the trapezoids is considered here as X, and the X changed for estimating the conversion efficiency were D/2, D/4, and D/16, where D is the flat width of the top opening surface 426. FIG. 4B are the results for the photovoltaic cell based on to then trapezoids structures of having three different angle. Results has been compared with that of the conventional photovoltaic cell (as shown in FIG. 1) having the flat surface. Noted here that the estimated results is for the Si—PV having substrate thickness of 350 μm, width (D) of trapezoids open top open surface and the gap (G) considering vertical cylindrical case, are 0.3 μm. The results showed that higher conversion efficiency over 40% could be achieved for all the trapezoidal structures, as shown in FIG. 4A. More higher conversion efficiency is also expected once the all parameters such as cell's structural and physical parameters, substrate parameters are optimized, Higher conversion as compared with the conventional photovoltaic cell is possible due to increasing of the surface area of the photovoltaic cell and also increasing of the solar spectrum intensity by self concentrating effect, as explained in FIGS. 3A, 3B, 3C, and 3D.

Figures 5, 5C:
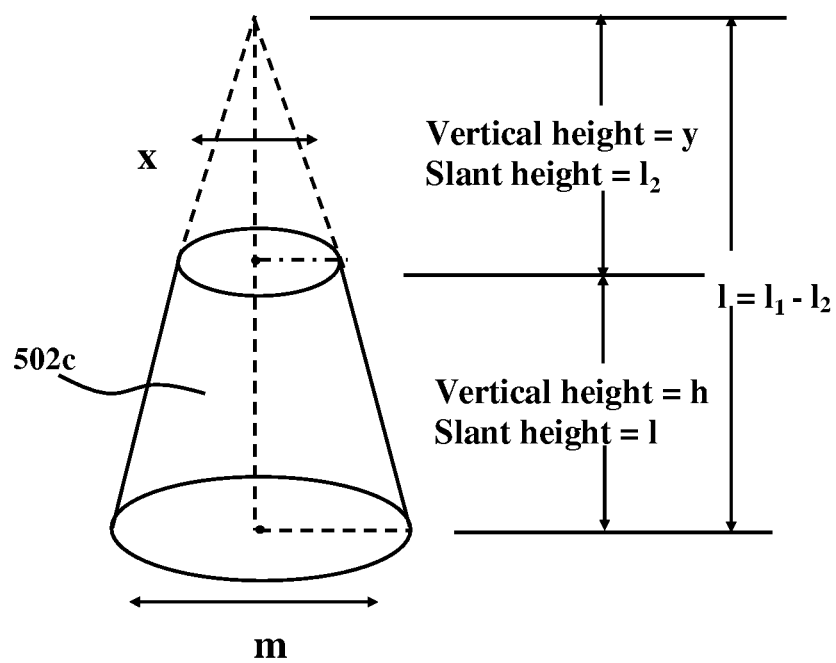

Increasing of the conversion efficiency for the fixed exposed area utilizing of the trapezoidal structure help to increase of the higher short circuit current as compared with that of the conventional photovoltaic cell of having flat surface. If the area increases, the number of the trapezoids are also increased and the short circuit will be increased tremendously. The conversion efficiency is expected to increase for all vertical structures such as the cylindrical, trapezoidal, cone (or pyramid) etc. FIGS. 5A, 5B, and 5C are the schematics of the photovoltaic cells made from the trapezoids, cylindrical, and pyramid structure according to this invention. They are uniformly arranged on the substrate 500. Each cell comprising of the different structure. For example, cell can be comprised with trapezoids structure 502a, cylindrical structure 502b, or trapezoidal originated from cylinder 502c etc. Alternatively cell can be comprised with mixing of two or all, convenient to manufacturing process. In each cases, n number of the structures (e.g. trapezoids, cylindrical etc) are arranged in a×a sized substrate. For each cases, the ratio of the surface area to the total base area of a×a is increased with reducing of their sizes. In all cases as shown in FIGS. 5A, 5B, and 5C, increasing the ratio indicates the increasing of the conversion efficiency as compared to that of the conventional cell having flat surface.

According to a preferred embodiment illustrated in FIG. 6A, shown is a photovoltaic cell comprising plurality of micrometer(s)-scaled pyramid 601 formed on the supporting substrate 600 (after having groove). The micrometer(s)-scaled pyramids 601 can have metallic electrical conduction, p-type or n-type semiconductor electrical conduction. The micrometer(s)-scaled pyramids are further surrounded by an electronic material 602 having metallic electrical conduction, p-type or n-type semiconductor electrical conduction. The electronic material 602 can be separated material or electronics materials of p or n type formed inside 601 and 600. The electronic material 602 and the supporting substrate 600 are further electrically connected to electrodes 603a and 603b, respectively. The electrode 603a and 603b are intended to serve as common electrodes that connects all pyramids 601. The electrode 603a is provided for the electronic material or junction 602. The electrode 603a can be transparent (not shown here) and can be formed on the electronic material or junction 602. The interface between the micrometer scaled pyramids 601 and the electronic material (or junction) 602 form pn- or Schottky junctions where built-in potential for both electrons and holes is generated.

According to this invention, alternatively the micrometer(s)-scaled pyramids 601 can be formed on separate substrate (not shown here), and the electrode 603b can be formed on the substrate to have common contact for each micrometer(s)-scaled pyramids 601, necessary for creating junction. In way of an example not way of limitation, the nanometer(s) or micrometer(s)-scaled pyramids 601 can be made of n-type semiconductor and the electric material 602 that on or surrounds the micrometer(s)-scaled pyramids 601 can be made of p-type semiconductor. Incident light 604 enters the photovoltaic cell through either the electrode 603a (not shown here) or on the material or junction 602. (In FIG. 6A, the incident light enters the photovoltaic cell through the electrode 602). The incident light 604 travels through pyramids 601, electronic material (n or p-type) or junction 602, and the substrate 600. As the incident light 604 travels through the micro-scaled pyramids 601, and electronic material 602, a numerous number of electrons (not shown here) are generated in the region near the electrode 603a. Portion of light 604 which passes through the valley portion of the pyramids where the electronic material 607 is used for passivation or make the junction in between micro-scaled pyramids 601 are traveled through the electronic material 602 and the supporting substrate 600 and generates electrons (not shown here). Some of which generated closer to electronic material 602 are collected and some of which are generated in the region far from 602 are recombined and lost. It should be pointed out that electrons are apparently generated all over the region along the thickness of the electric material or junction 602. In addition, as the incident light 604 travels through the micrometer(s)-scaled pyramids 601, a numerous number of holes (not shown here) are generated in the pyramids 601 and in the substrate 600, respectively. It also should be pointed out that holes are apparently generated all over the region along the thickness of the micrometer(s)-scaled pyramids 601 and the substrate 600. Photo-generated electrons generated in the electronic material 602, pyramids 601, and substrate 600 diffuse toward pn-junctions, created at the interface between the micrometer(s)-scaled pyramids 601 and the electronic material or junction 602, and also at the interface between the electronic material 602 and substrate 600. At the pn-junctions, the electrons and the holes are swept away by built-in potential, thus photovoltaic effects set in. As mentioned earlier, beam 604 incident on to the tilted surface 608 will have almost the intensity closer to the solar spectrum. As the surface area is increased due to utilize of the pyramid structure, the conversion efficiency is increased. As there are no gaps located in between two pyramid structures, beam concentration (considering the fixed base area) is only expected on the tilted surface.

Unlike conventional solar cell, the solar cell, as shown in FIG. 6A, has pn-junction in the regions of all sides 608 of the pyramids 601. The pn-junction formed on the side 608 of pyramids having height h has surface area, dependent on the height h of the pyramids 601. The light 604 travels perpendicular to the direction of the pn-junction formed across side 608 of the pyramids and most of the light flux incident on the pn-junction are absorbed and most of the photo-generated carriers can be collected. The light 604 travels perpendicular to the pn-junctions formed at the side 608 of the pyramids 601. Most of the light flux incident onto the sides can also be absorbed, and the carriers generated by the light 604 can be collected without recombination (ideally). It is apparent that utilizing the solar cell as shown in FIG. 6A can (i) reduce the recombination, (ii) increasing the surface increasing the more intensity for the fixed base area, and (ii) absorb all photo flux as transmitted to the semiconductor, thereby increasing the conversion efficiency.

According to a preferred embodiment illustrated in FIG. 6B, shown is a photovoltaic cell comprising plurality of micrometer(s) or nanometer(s)-scaled trapezoidal 610 formed on the supporting substrate 600 (after having groove). Only differences in FIG. 6B as compared with that of FIG. 6A is that the top 612 is opened and receives the portion of the light 604. Similar to FIG. 6A, this case also surface area of junction for receiving the light 604 is increased due to reduction of the photo-generated carrier recombination, increasing the surface area, basically increasing the more flux too incident, and absorption of all photo-flux incident on the surface and thereby increasing the conversion efficiency.

According to a preferred embodiment illustrated in FIG. 6C, shown is a photovoltaic cell comprising plurality of micrometer(s) or nanometer(s)-scaled trapezoidal 610 formed on the supporting substrate 600 (after having groove). Only differences in FIG. 6C as compared with that of FIG. 6B, is that the gap 614 is opened and receives the portion of the light 604. As mentioned earlier, based on the height h of the trapezoids and the side angle, the incident light 604 incident on to the gap located in between two trapezoids (e.g. 610 and 616), is concentrated and increase the conversion efficiency. Similar to FIGS. 6A and 6B, this case also surface area (corresponding to the junction area) for receiving the light 604 is increased due to reduction of the photo-generated carrier recombination, increasing the surface area, basically increasing the more flux too incident, concentrating incident light, and absorption of all photo-flux incident on the surface and thereby increasing the conversion efficiency.

Apparent advantage of this invention as shown in FIGS. 6A, 6B, and 6C, over conventional photovoltaic cells is directly associated with the fact that, unlike conventional photovoltaic cells, large portion of the pn-junctions are used for collecting all photo generated carriers created in the electronic material 602, no matter where they are generated, the distance the photo generated carriers have to diffuse to reach the pn-junctions created on the surface of the pyramids (601) or trapezoidal (610) is within the range of the diffusion length of the carriers and independent to the location where they are generated. Furthermore, for all photo generated carriers in the pyramids (601) or trapezoidal (610), no matter where they are generated, the distance the photo generated carriers have to diffuse to reach pn-junctions is within the range of the diffusion length of the carriers. Selecting height h and the base m of the pyramids (601) or trapezoidal (610), all carriers generated inside semiconductor can be collected. According to this invention, the recombination can be made to zero (ideally) and all photon flux can be absorbed (ideally), and the conversion efficiency can be made to ~100% and even >50% using of the Si. On the other hand, as explained in the description for the prior art shown in FIG. 1, in conventional photovoltaic cells where pn-junctions are perpendicular to the direction to which incident light travels, the photo generated carriers generated in region far away from pn-junctions need to diffuse much longer distance (diffusion-length) than that for the photo generated carriers generated near the pn-junctions, thus they have a greater chance to recombine without contributing to photovoltaic effects. Therefore in this invention, PCCE is expected to be much higher than that in conventional photovoltaic cells. In addition, it is evident that the total effective area that contributes to photovoltaic effect in this invention can be increased significantly a few orders (>3000) considering 300 mm diameter substrate, 500 μm height rods having 50 nm diameter and 50 nm pitch.

According to this invention, in way of an example not way of limitation, the supporting substrate 600 can be n-type or p-type Si of <100> orientation, on which the peramids (601) or trapezoidal (610) can be formed by using the process of patterning using the standard photolithographic technique, and wet etching using of KOH solution. The dopants of opposite type of substrate can be diffused into the surface of the peramids (601) or trapezoidal (610) to form the electronic material 602 of Si p-type. Conformal deposition of the dielectric material (not shown) can be done for planarization, and in this case silicon oxide or polymer can be used. Without dopant diffusion, the electronic material 602 can be separate Si-epitaxial growth to make the junction with the Si-substrate. According to this invention, in a way of an example not way of limitation, the supporting substrate 600 can be Ge, GaAs, InP, GaN, ZnO, CdTe, or any suitable semiconductor substrate etc. in which pyramids 601 or trapezoidal 610 can be formed. Alternatively, the supporting substrate 600 can be polymer material, metal (e.g. copper) on which semiconductor can be deposited or formed either by deposition or electrolytic way, ad the pyramid 601 and trapezoidal 610 are formed o the substrate prior to formation of semiconductor on it.

Figure 7A:
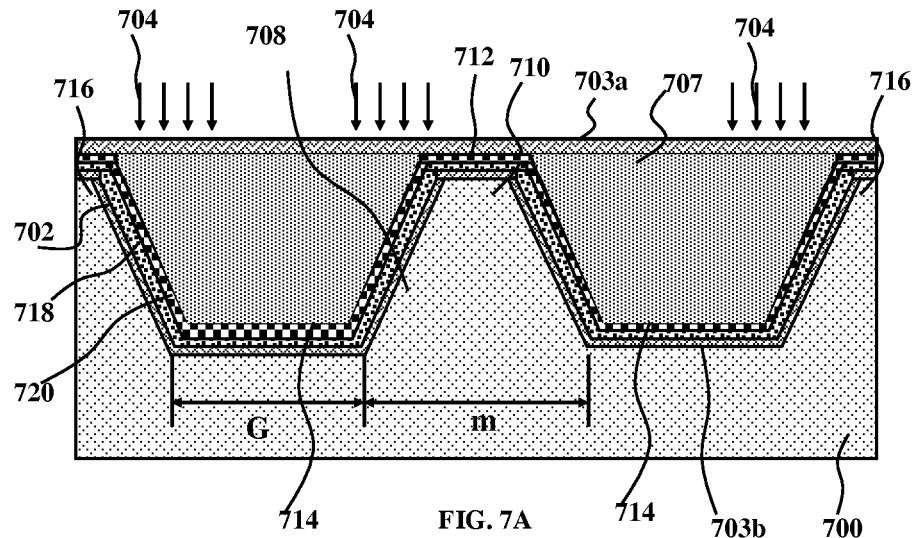
FIGS. 7A, 7B, 7C, and 7D are the cross-sectional views of photovoltaic cells made from thin film and formed on the electronic material substrate according to this invention.

According to a preferred embodiment illustrated in FIG. 7A, shown is a photovoltaic cell comprising plurality of micrometer(s)-scaled trapezoidal 710 formed on the supporting substrate 700 (after having groove). The micrometer(s)-scaled trapezoid 710 can have metallic electrical conduction, p-type or n-type semiconductor electrical conduction. The micrometer(s)-scaled trapezoids are further surrounded by an electronic materials 718 and 720 having metallic electrical conduction, p-type or n-type semiconductor electrical conduction. The electronic materials 718 and 720 can be separated material or electronics materials of p or n type formed into the substrate 700. The electronic materials 718 and 720 having the junction of 702 are further electrically connected to electrodes 703*a* and 703*b*, respectively. The electrode 703*a* and 703*b* are intended to serve as common electrode that connects all trapezoids 710. The electrode 703*a* is provided for the electronic material or junction 702. The electrode 703*a* can be transparent (not shown here) and can be formed on the electronic material or junction 702. The interface between the micrometer scaled trapezoids 710 and the electronic material (or junction) 702 form pn- or Schottky junctions where built-in potential for both electrons and holes is generated. According to this invention, the substrate 700 act as the carrier substrate for making the trapezoids 710. The substrate can be glass, metal, ceramics, polymer, or semiconductor. Alternatively, according to this invention, the carrier substrate can be the solid metal or metal foils (not shown here). In that case, the substrate 700 and the common electrode 703*b* can be the one material.

According to this invention, alternatively the micrometer(s)-scaled trapezoids 710 can be formed on utilizing the semiconductor substrate (not shown here), and the electrode 703*b* can be formed on back side of the substrate to have common contact for each micrometer(s)-scaled trapezoids 710, necessary for creating wide surface area. In way of an example not way of limitation, the nanometer(s) or micrometer(s)-scaled trapezoids 710 can be made of n-type semiconductor substrate and the thin film material that on or surrounds the micrometer(s)-scaled trapezoids 710 can be made of p-type semiconductor.

Incident light 704 enters the photovoltaic cell through either the electrode 703*b* (not shown here) or on to the top electrode 703*a*. (In FIG. 7A, the incident light enters the photovoltaic cell through the electrode 703*a*). The incident light 704 travels through trapezoids 710, electronic materials 718 and 720 (n or p-type) or junction 702, and the substrate 700. As the incident light 704 travels through the microscaled trapezoids 710, and electronic materials 720 and 718, junction 702, a numerous number of electrons (not shown here) are generated in the region near the electrode 703*a*. Portion of light 704 which passes through the opening portion located in between two trapezoids (e.g. 710 and 716) where the electronic material 707 is used for passivation or make the junction in between micro-scaled trapezoids 710 are traveled through the electronic materials 718 and 720, junction 702 and the supporting substrate 700 and generates electrons (not shown here). Some of which generated closer to electronic material/junction 702 are collected and some of which are generated in the region far from 702 or in the passivation layer 707, are recombined and lost. It should be pointed out that electrons are apparently generated all over the region along the thickness of the electric material (718 and 720) or junction 702. In addition, as the incident light 704 travels through the micrometer(s)-scaled trapezoids 710, a numerous number of holes (not shown here) are generated in the trapezoids 710. Photo-generated electrons generated in the electronic materials (718 and 720), junction 702, passivation 707, and substrate 700 diffuse toward pn-junctions 702, created at the interface between the electronic materials 718 and 720, and also at the interface between the electronic material 702 and substrate 700. At the pn-junctions, the electrons and the holes are swept away by built-in potential, thus photovoltaic effects set in. As mentioned earlier, beam 704 incident on to the tilted surface 708 will have almost the intensity closer to the solar spectrum. As the surface area is increased due to utilize of the trapezoids structure, the conversion efficiency is increased. Light incident onto the to the gaps 714 located in between two trapezoids structures for example 710 and 716, beam is concentrated and increase the carrier generation. The beam concentration is also expected for the beam incident onto the tilted surface 708 is also expected as the surface area increases per fixed base area.

Unlike conventional solar cell, the solar cell, as shown in FIG. 7A, has pn-junction in the regions of all tilted sides 708 of the trapezoids 710 (and 716), the gap 714 created in between two trapezoids (e.g. 710 and 716). The pn-junction formed on the side 708 of trapezoids having height h has surface area, dependent on the height h of the trapezoids 710. The light 704 travels perpendicular to the direction of the cell and incident onto the top flat surface 712, tilted side 708, and the gap 714. The intensity of the light incident on to the top flat surface 712 is same as that of the original light intensity I of 704. Light incident onto the tilted surface 708 and open gap 714 have the intensity more than the intensity I, due to the self concentrating by the cell structure and it explains as follows. When the light light perpendicularly incident to the tilted side 708 of the trapezoids, and some of the light not shown is reflected and portion of light is transmitted into the pn-junction, not shown here (for details see FIGS. 3C and 3D). The light component from other trapezoids also reflected back and some portion is transmitted from nearest trapezoids tilted side 9 not shown here). It is estimated that light beam transmitted into the tilted side can be made more than 0.85 times of the original intensity of the light after optimizing the structure especially height h and angle α. Based on the side surface area increases per fixed area, the light intensity can be concentrated and amplified if we compare with the base area. The light 704 travels perpendicularly and incident on to the gap 714 has several components of light in addition to the light (I) incident perpendicularly. Other components (not shown here) are the reflected light components originated from the tilted side 708 of nearest trapezoids. Based on the aspect ratio (ratio of the height to gap of the trapezoids), the light incident onto the gap 714 (see 328 of FIG. 3D) can be enhanced or multiplied. According to this invention, the structure can be trapezoidal, cylindrical, pyramid etc. and they can be a part of the substrate or building block onto the substrate.

According to this invention, the light intensity incident onto the surface top, tilted, and gap, they are concentrated and they can be absorbed. The carriers generated by the all light component (not shown here) can be collected without recombination (ideally). It is apparent that utilizing the solar cell as shown in FIG. 7A can (i) reduce the recombination, (ii) increasing the surface increasing the more intensity for the fixed base area, and (ii) absorb all photo flux as transmitted to the semiconductor, thereby increasing the conversion efficiency.

Figure 7B:
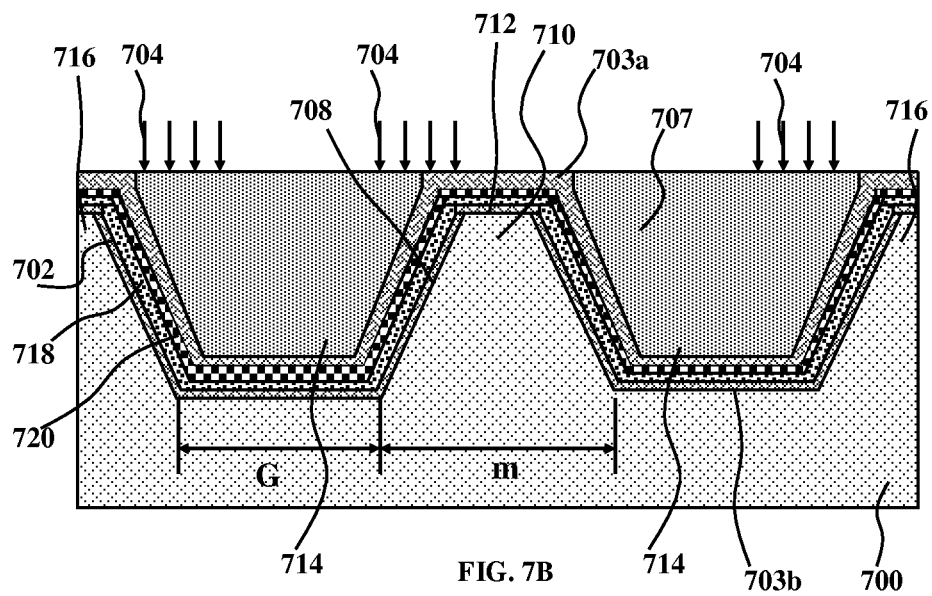

According to this present invention, alternatively the top electrode 703*a* can be made directly onto the top of the electronic material 720. FIG. 7B shows the schematic representing the photovoltaic cell according to this invention, wherein, the same numeral represent the same parts as explained in FIG. 7A, and repeated explanation is omitted here. The difference in FIG. 7B as compared to FIG. 7A is that, the electrode is made onto the electronic material 720 in all sides, for example top 712, tilted side 708, and the gap 714.

The photovoltaic cell explained in FIGS. 7A and 7B, are based onto the electronics materials 718 and 720 which can be based on the radiation tolerant materials for example CdS, CdTe etc. If those material or material systems which are not highly tolerant under radiation material systems such as Si, Polymer, GaAs, etc. are used, then the radiation tolerant material is to be needed to prevent the photovoltaic cell damage from radiation. According to this invention, at least one layer for example 722 (shown in FIG. 7C) is to be needed onto the top of the photovoltaic cell to prevent the photovoltaic cell from damaging due to the radiation. The additional layer 722 is made onto the top of the photovoltaic cell. The layer will reduce and/or completely alleviate the radiation dose exposing directly onto the photovoltaic cell. The difference in FIG. 7C as compared to FIG. 7B is that an additional layer 722 is used to protect from the radiation exposure.

Figure 7C:
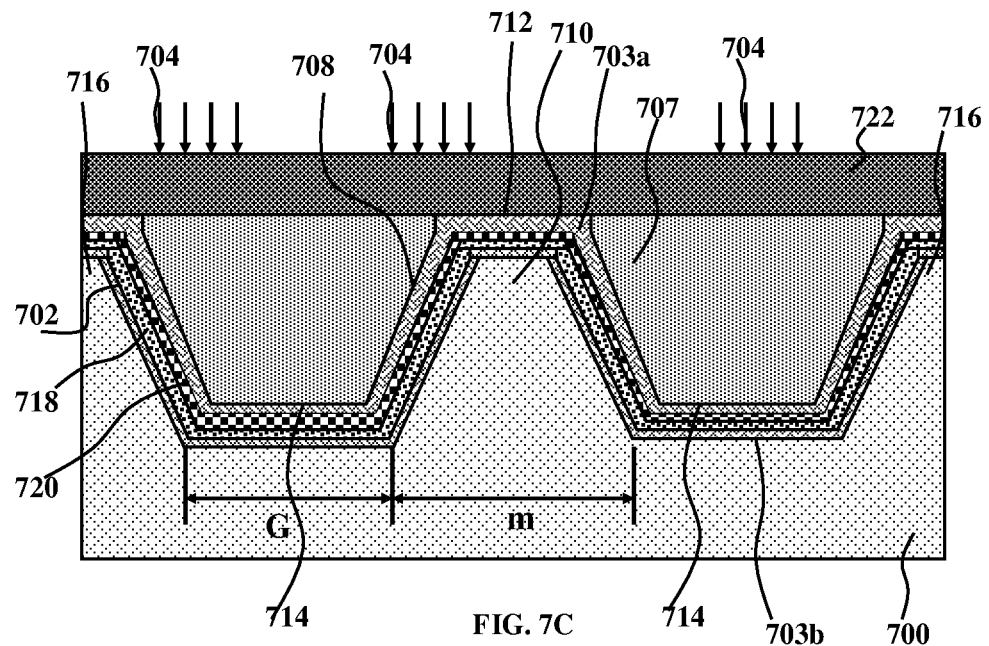
Figure 7D:
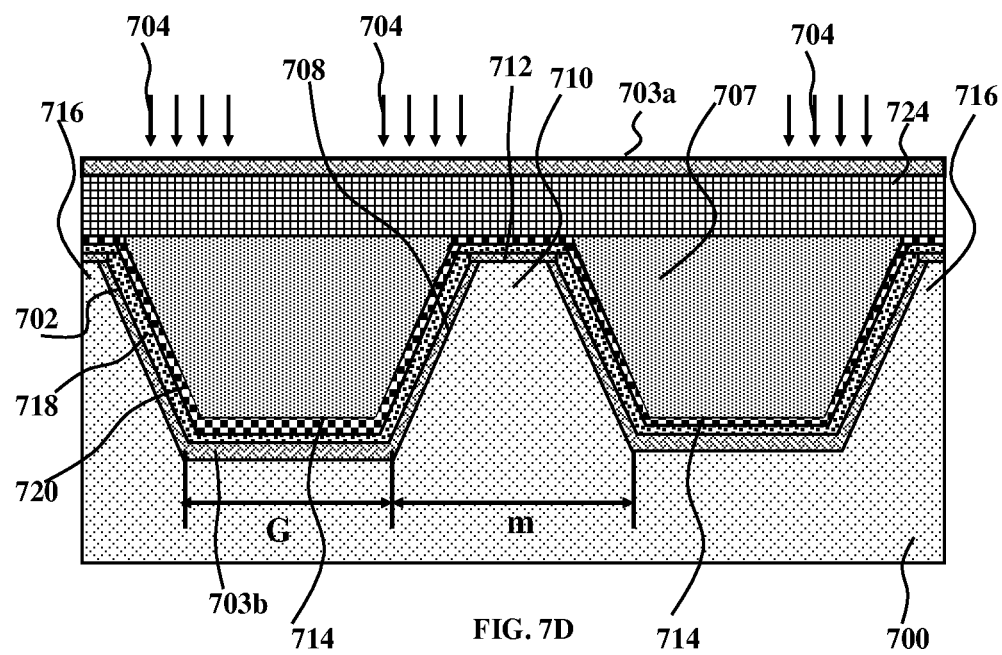

According to this invention, the photovoltaic cell can be made to have more than one junction. FIG. 7D is the schematic showing an cross-sectional view of photovoltaic cell wherein the same numerals are the same parts as explained in FIGS. 7A, 7B, and 7C, so that repeated explanation is omitted here. The top junction formed by the additional electronic material 724, can be flat and the second junction 702 can have larger surface area, as explained in FIGS. 6A, 6B, 7A, 7B, and 7C. The top junction formed by the electronic material 724 can absorb comparatively lower wavelength light and longer wavelength lights are absorbed by the second junction 702. In this way, the broad ranges of solar spectrum can be possible and the conversion efficiency can be further increased, according to this invention. Alternatively, type of top layer material 724 can be either electronic material to create the semiconductor junction or the material having high radiation tolerant for the case of the photovoltaic cell for space application. The difference in FIG. 7D, as compared to FIG. 7C, is that addition layer 724 is used either for creating an another junction to extend the solar spectrum absorption or to prevent the photovoltaic cell from the radiation exposure. Alternatively, more than two junctions utilizing the combination of flat and grooved junctions can also be used according to this invention.

According to this invention, explained in FIGS. 7A, 7B, 7C, and 7D, the substrate 700 can be act as the carrier substrate for creating the structures of trapezoids, pyramid, cylindrical etc. to have larger surface area (and also larger junction area). The type of substrate can be semiconductor, polymer, ceramic, solid metal, metal foil. In the case of the semiconductor using as carrier 700, a layer of dielectric material may be required to isolate the photovoltaic cell and semiconductor current injection or leaking (not shown here). If the solid metal or metal foil is used as the carrier substrate than the metal (used as the carrier substrate) can be also used one of the common electrode (or contact). If the ceramics or polymer is used as the carrier substrate is used, the structures of trapezoids, cylindrical, or pyramid etc. can be made on the substrate using molding, casting, etching, or printing technology.

According to this invention. alternatively, structures of trapezoids, cylindrical, or pyramid of same or different type of material can be made onto the carrier substrate by a process or transferring the pre-formed structures on foreign substrate (not shown here) are transferred to the substrate (700) acting as the carrier substrate.

Figure 8:
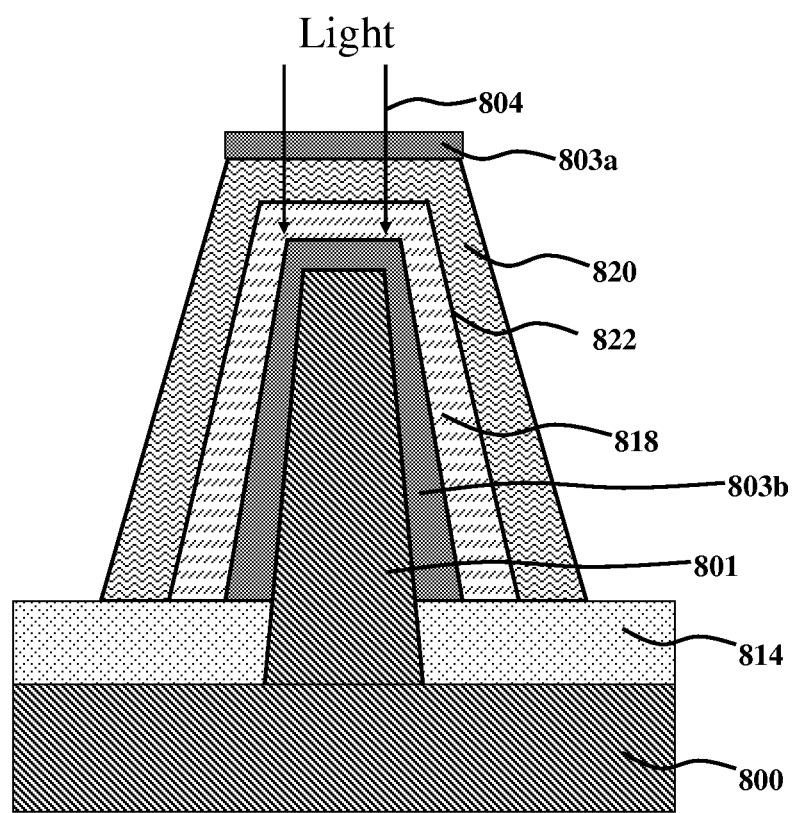

In an alternative preferred embodiment shown in FIG. 8, a photovoltaic cell comprises plurality of micro or nanometer(s)-scaled trapezoidal or cylinder 801 are electrically connected to a substrate 800. The cylinder or trapezoidal 801 can have metallic electrical conduction, p-type or n-type semiconductor electrical conduction. The dielectric layer 812 on the substrate 800 isolate the cylinder or trapezoidal shaped rods. The micro or nanometer(s)-scaled trapezoidal or cylinder 801 are further surrounded by an electronic materials 818 and 820 having metallic electrical conduction, top and bottom contacts 803*a* and 703*b*. The electronic materials 818 and 820 form p-type or n-type semiconductor electrical junction 822. The electronic materials 818 and 820 can be separated material or electronics materials of p or n type formed inside or on 801 and 800. The electronic materials 818 and 820 are further electrically connected to electrodes 803*a* and 803*b*, respectively. The electrodes 803*a* and 803*b* are intended to serve as common electrodes that connects all cylinder or trapezoidal shaped electrical junction 822. The electrode 803*a* is on the electronic material 820. The interface between the nanometer(s)-scale tubes 818 and the electronic materials 820 form pn- or Schottky junctions 822, thus there are pn- or Schottky junctions on both sides, inside and outside, of the micro or nanometer(s)-scale trapezoidal or cylindrical rod 801.

According to this invention, alternatively the nanometer(s) or micrometer(s)-scale tubes, wires or trapezoids, 801 can be formed on the substrate (not shown here), and the electrode 803*a* can be made on the substrate to have a common contact for each nanometer(s)-scale rods 801, necessary for creating junction.

In way of an example not way of limitation, the micro or nanometer(s)-scale trapezoidal or cylindrical rod 801 can be made of metal and the electronic materials 818 and 822 that surrounds or around the micro or nanometer(s)-scale trapezoidal or cylindrical rod 801 can be made of p-type semiconductor, thus the interface of 818/822 forms pn-junctions in micro or nanometer(s)-scale trapezoidal or cylindrical rod 801. Incident light 804 enters the photovoltaic cell through the electronic materials 820 (front-side of the cell). As the incident light 804 travels through the electronic material 820, numerous numbers of electrons (not shown here) are generated. It should be pointed out that electrons (of electron-hole pairs) are apparently generated all over the region along the thickness of the nanometer(s) or micrometer(s)-scale blocks (e.g. rods) 801 and also the gaps 814 in between blocks 801. Photo-generated electrons in the electronic materials 818 and 820 made of p and n-type—type semiconductors, then diffuse toward pn-junctions 822 in the interface of 818/820. At the pn-junctions, the diffused electrons are swept away by built-in potential, thus photovoltaic effects set in.

Common advantages already described for the photovoltaic cell in FIGS. 6 and 7, can be achieved in this invention. Only difference of forming the nano or micro-scaled blocks which are formed without forming the grooves.

According to this invention, in way of an example not way of limitation, the supporting substrate 800 can be Si substrate, on which trapezoidal or slanted cylinder can be made by conventional photolithography followed by wet etching using standard etchant (e.g. KOH solution). In order to isolate the slanted trapezoidal, dielectric layer of silicon oxide can be used. Different type of thin-films of p-type and n-type can be deposited on the slanted cylinder 801 after uniformly metallization to form the electrode 803b. The thin films could be any suitable thin films which could form the junction. For example, they are the combination of CdTe/CdS, Zn(Cd)Te/Zns, ZnO based materials, Si based alloyed material (e.g. Si:Ge or a-Si), GaAs or InP based alloyed materials etc. Conformal deposition of the electronic material can be done based on the slant angle and planarization (not shown here) can be made by depositing the passivation layer (polymer or silicon oxide).

According to this invention, in way of an example not way of limitation, the supporting substrate 800 can be Ge, GaAs, GaN, InP, GaN, CdTe, or ZnO.

Figure 9:
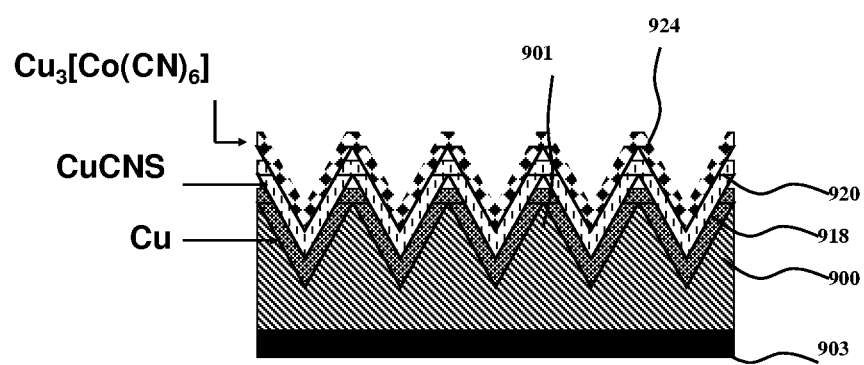
FIG. 9 is the schematic showing the cross-sectional view of photovoltaic cell structure based on the photochemical material in accordance to the present invention.

In an alternative preferred embodiment shown in FIG. 9, a photovoltaic cell comprises plurality of micro-meter(s) scaled pyramid or trapezoidal 801 are electrically connected to a substrate 900. The micro-meter(s) scaled pyramid or trapezoidal 901 are further surrounded by an electronic materials 918 and 920 having metallic electrical conduction. The electronic materials 918, 920, and 924 and the supporting substrate 800 are further electrically connected to electrodes 903, respectively. The micro-meter(s) scaled pyramid or trapezoidal-shaped has top surface with electronic material of 924 can form the have metallic electrical conduction, with suitable electrolyte solution (not shown). For collecting the charge from the electrolyte, another electrode is placed in the electrolyte (not shown here).

The structures to increase the surface area (equivalent to the junction area) can be made alternatively by using the nano-blocks of having few nanometer sizes, the quantum confinement effect is possible. Absorption of broad solar spectrum can be possible utilizing the different sizes and different semiconductor nano-scaled blocks.

Apparent advantage of this invention over conventional photovoltaic cells is directly associated with the fact that, unlike conventional photovoltaic cells, at least one junction having larger surface area and also have the capability of self concentration as explained in FIGS. 2 to 5 are created for increasing the carrier generation and also for collecting all photo generated carriers created in the absorption layer, no matter where they are generated. According to this invention, the recombination can be made to zero (ideally) and all photon flux can be absorbed (ideally), and the conversion efficiency can be made to ~100% and even >50% using of the Si. On the other hand, as explained in the description for the prior art shown in FIG. 1, in conventional photovoltaic cells where electrical-junctions are perpendicular to the direction to which incident light travels, the photo generated carriers generated in region far away from electrical-junctions need to diffuse much longer distance (diffusion-length) than that for the photo generated carriers generated near the junctions, thus they have a greater chance to recombine without contributing to photovoltaic effects. Therefore in this invention, PCCE is expected to be much higher than that in conventional photovoltaic cells for specific wavelength. In addition, it is evident that the total effective area that contributes to photovoltaic effect in this invention can be increased significantly a few orders (>3000) and also the light incident onto the gap in between two structures have the concentrating light. Both effects will increase the carrier generations and thereby increase the conversion efficiency.

According to this invention, in way of an example not way of limitation, the supporting substrate (600, 700, 800, or 900) can be ceramics, glass, polymer or any kind of semiconductor on which transparent or nontransparent metal contact (603b, 703b, or 803b) is made. Alternatively, supporting substrate (600, 700, 800, or 900) can be metal which also acts the metal contact. For this case, copper, stainless steel, Aluminum, alloyed metal, or their thin metal foil, can be used. According to this invention, the nanoor micro structured of trapezoids, cylinder, or pyramid, can be any kind of semiconductor or compound semiconductors, having the absorption capability in the desired spectrum region. They could be Si, Ge, InP, GaAs, CdSe, CdS, CdTe, ZnO, ZnTe, ZnCdTe, CuInSe, CuSe, InGaAs.

According to this invention, the nano or micro scaled structures could be GaN materials (n or p type) and the dozens of the materials could be $In_{1-x}Ga_xN$ (p or n type, opposite to GaN rods). With increasing of the Ga contents, the band-gap of InGaN can be increased to close to 3.4 eV which is same as that of the GaN. With increasing of the In contents in InGaN, the band gap can be reduced to ~0.65 eV. Photons with less energy than the band gap slip right through. For example, red light photons are not absorbed by high-band-gap semiconductors. While photons with energy higher than the band gap are absorbed—for example, blue light photons in a low-band gap semiconductor—their excess energy is wasted as heat.

According to this invention, alternatively the, nano or micro scaled structures could be III-V based materials (n or p type) for example InP and the dozens of the materials could be III-V based material for example $In_{1-x}Ga_xAs$ (p or n type, opposite to InP rods). In this case, with adjusting of In contents, band gap can be tuned and thereby the wide spectrum of the solar energy can be absorbed.

According to this invention, alternatively nano or micro scaled structures could be II-V based materials (n or p type) for example CdTe and the dozens of the materials could be II-VI based material for example CdZnS (p or n type, opposite to CdTe rods) or Zn(Cd)Te/ZnS based materials. In this case, with adjusting of Zn contents, band gap can be tuned and thereby the wide spectrum of the solar energy can be absorbed.

According to this invention, alternatively nano or micro scaled structures, could be Si (or amorphous Silicon materials (n or p type) and the dozens of the materials could be Si:Ge alloy (p or n type, opposite to Si rods). In this case, with adjusting of Ge contents, band gap can be tuned and thereby the wide spectrum of the solar energy can be absorbed.

According to this invention, alternatively nano or micro scaled structures could be Si, InP, or CdTe (n or p type) and the dozens of the materials, could be different material which could make the junction with the rods (wires or tubes) and each type of material has the specific band gap for absorbing the specific range of solar spectrum. In this way also wide range of solar spectrum can be absorbed, and with increasing of the junction area (due to use of the rods, wires, or tubes), the electrical power generation could be increased tremendously 50 times and beyond.

According to this invention, the nanoparticles or nanometer(s)-scale wires, mentioned in the preferred embodiments, can be any kinds of electronics materials covering semiconductor, insulator or metal.

According to this invention, nano or micro scaled structures can be made from the semiconductors such as Si, Ge, or compound semiconductors from III-V or II-VI groups. As an example for rods, wire, or tubes, InP, GaAs, or GaN III-V compound semiconductor can be used and they can be made using standard growth process for example, MOCVD, MBE, or standard epitaxial growth. According to this invention, the self-assembled process can also be used to make wires, rods, or tubes and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

According to this invention, nano or micro scaled structures based on II-VI compound semiconductor can also be used. As an example CdTe, CdS, Cdse, ZnS, or ZnSe can also be used, and they can be made using standard growth process for example, sputtering, evaporation, MOCVD, MBE, or standard epitaxial growth or chemical synthesys. According to this invention, the self-assembled process can also be used to make nano or micro scaled structures, and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

According to this invention, nano or micro scaled structures can be made from the carbon type materials (semiconductor, insulators, or metal like performances) such as carbon nano-tubes, which could be single, or multiple layered. They can be made using standard growth process for example, MOCVD, MBE, or standard epitaxial growth. According to this invention, the self-assembled process can also be used to make wires, rods, or tubes and their related pn-junction to increase the junction area. These tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope. Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in the novel photo-voltaic cells which as higher power generation capability (25 times and beyond) as compared with that of the conventional cells. The proposed invention can be used for fabricating wide solar panel for both commercial and space applications.

What is claimed is:

1. A photovoltaic cell comprising:
a first electrode;
an electric substrate having a top surface, overlying said first electrode, comprising a first electric material of p or n type with a three dimensional geometric pattern etched out of the said top surface of the substrate, said substrate being as single piece of material;
a second electric material of type opposite to the first electric material and of uniform thickness coating the three dimensional geometric pattern of the electric substrate, thereby providing a p-n junction along the interface between the first electric material and the second electric material that conforms to the contour of the three dimensional geometric pattern of the said top surface of said electric substrate,
  whereby a top surface of the second electric material provides a three dimensional geometric pattern that follows the contour of the three dimensional geometric pattern of the said top surface of said electric substrate,
  wherein the three dimensional geometric pattern of the top surface of said second electric material has an array of pyramidal, conical, truncated pyramidal, or truncated conical shaped nano-scaled protruding structures separated by gaps,
  wherein each said protruding structure has tilted sides, a base, an internal angle alpha between the tilted sides and the base, and a height,
  wherein the gaps separate the bases of said protruding structures,
  wherein the bases of said protruding structures are oriented such that said bases of said protruding structures are coplanar,
  wherein the internal angle alpha of each said protruding structure is between 4 and 90 degrees, thereby concentrating some light incident on the tilted sides of each said protruding structure onto the gaps between said protruding structures,
  and wherein the height of each said protruding structure, the internal angle alpha of each said protruding structure, and the gaps between said protruding structures are oriented to reflect some light incident on the tilted sides of each said protruding structure back and forth between the tilted sides of adjacent said protruding structures;
a second electrode of uniform thickness completely covering the top surface of said second electric material, wherein said second electrode is formed from transparent material;
a passivation material, transparent to light that fills the gaps in the three dimensional geometric pattern of the surface of the second electric material and levels the top surface of the second electric material and a radiation tolerant layer on top of the whole cell to protect the photovoltaic cell from radiation damage.

2. A photovoltaic cell according to claim 1, wherein said first electric material is selected from the group consisting of Si, CdTe, GaAs, InP, Ge, ZnO, Si:Ge, GaSb, CdZnTe, InSb, HgCdTe, and GaN.

3. A photovoltaic cell comprising:
a first electrode;
an electric substrate having a top surface, overlying said first electrode, comprising a first electric material of p or n type with a three dimensional geometric pattern etched out of the top surface of the substrate, said substrate being a single piece of material,
    wherein the three dimensional geometric pattern has an array of pyramidal, conical, truncated pyramidal, or truncated conical shaped nano-scaled protruding structures separated by gaps,
    wherein each said protruding structure has tilted sides, a base, an internal angle alpha between the tilted sides and the base, and a height,
    wherein the gaps separate the bases of said protruding structures,
    wherein the bases of said protruding structures are oriented such that said bases of said protruding, structures are coplanar,
    wherein the internal angle alpha of each said protruding structure is between 45 and 90 degrees, thereby concentrating some light incident on the tilted sides of each said protruding structure onto the gaps between said protruding structures,
    and wherein the height of each said protruding, structure, the internal angle alpha of each said protruding structure, and the gaps between said protruding structures are oriented to reflect some light incident on the tilted sides of each said protruding structure hack and forth between the tilted sides of adjacent said protruding structures;
said electric substrate further comprising a second electric material of type opposite to the first electric material inside the top surface of said electric substrate, wherein the interface between the first electric material and the second electric material forms a p-n junction conforming to the three dimensional geometric pattern of the top surface of said electric substrate;
a second electrode uniform thickness completely covering the top surface of the second electric material, wherein said second electrode is formed from transparent material; and
a passivation material transparent to light that fills the gaps in the three dimensional geometric pattern of the top surface of the second electric material and levels the surface of the second electric material.

4. A photovoltaic cell according to claim 3, wherein said p-n junction is formed by diffusing dopants into said electric substrate to create said second electric material.

5. A photovoltaic cell according to claim 3, wherein said first electric material is selected from the group consisting of Si, CdTe, GaAs, InP, Ge, ZnO, Si:Ge, GaSb, CdZnTe, InSb, HgCdTe, and GaN.

6. A photovoltaic cell comprising:
a first electrode;
an electric substrate having a top surface, overlying said first electrode, comprising a first electric material of p or n type with a three dimensional geometric pattern etched out of the top surface of the substrate, said substrate being a single piece of material,
    wherein the three dimensional geometric pattern has an array of pyramidal, conical, truncated pyramidal, or truncated conical shaped nano-scaled protruding structures separated by gaps,
    wherein each said protruding structure has tilted sides, a base, an internal angle alpha between the tilted sides and the base, and a height,
    wherein the gaps separate the bases of said protruding structures,
    wherein the bases of said protruding structures are oriented such that said bases of said protruding structures are coplanar,
    wherein the internal angle alpha of each said protruding structure is between 45 and 90 degrees, thereby concentrating some light incident on the tilted sides of each said protruding structure onto the gaps between said protruding structures,
    wherein the height of each said protruding structure, the internal angle alpha of each said protruding structure, and the gaps between said protruding structures are oriented to reflect some light incident on the tilted sides of each said protruding structure back and forth between the tilted sides of adjacent said protruding structures,
    wherein said height of each protruding structure is micrometer-scaled;
    wherein said bases of each protruding structure have nanoscale diameter;
said electric substrate further comprising a second electric material of type opposite to the first electric material inside the top surface of said electric substrate, wherein the interface between the first electric material and the second electric material forms a p-n junction conforming to the three dimensional geometric pattern of the top surface of said electric substrate,
    wherein said p-n junction is formed by diffusing dopants into said electric substrate to create said second electric material;
a second electrode of uniform thickness completely covering the top surface of the second electric material, wherein said second electrode is formed from transparent material;
a passivation material transparent to light that fills the gaps in the three dimensional geometric pattern of the top surface of the second electric material and levels the surface of the second electric material; and
a radiation tolerant layer on top of the whole cell to protect the photovoltaic cell from radiation damage.

\* \* \* \* \*